United States Patent
Chian et al.

(10) Patent No.: US 10,418,836 B2
(45) Date of Patent: Sep. 17, 2019

(54) DEVICES, SYSTEMS, AND METHODS FOR TEMPERATURE BASED LIMITING OF BATTERY PACK DISCHARGE

(71) Applicant: MICROSOFT TECHNOLOGY LICENSING, LLC, Redmond, WA (US)

(72) Inventors: Daniel Tsuteh Chian, Los Altos, CA (US); Julian Arlo Binder, Boulder Creek, CA (US); Ruchi Jagdish Parikh, Sunnyvale, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 195 days.

(21) Appl. No.: 15/686,040

(22) Filed: Aug. 24, 2017

(65) Prior Publication Data

US 2019/0067975 A1   Feb. 28, 2019

(51) Int. Cl.
| H02J 7/00 | (2006.01) |
| G01R 19/165 | (2006.01) |
| G01R 31/382 | (2019.01) |
| G01R 31/389 | (2019.01) |
| G01R 31/392 | (2019.01) |

(52) U.S. Cl.
CPC ...... *H02J 7/0091* (2013.01); *G01R 19/16542* (2013.01); *G01R 31/382* (2019.01); *G01R 31/389* (2019.01); *G01R 31/392* (2019.01)

(58) Field of Classification Search
USPC .......................................................... 320/150
See application file for complete search history.

(56) References Cited

U.S. PATENT DOCUMENTS

| 5,200,689 A | 4/1993 | Interiano |
| 6,661,203 B2 | 12/2003 | Wolin et al. |
| 7,737,665 B2 | 6/2010 | Grewe |
| 9,075,090 B2 | 7/2015 | Zimmerman |
| 2012/0098543 A1* | 4/2012 | Rutkowski .......... H01M 2/1077 324/435 |
| 2013/0106355 A1 | 5/2013 | Kim |
| 2014/0217958 A1* | 8/2014 | Verdun ................. H02J 7/0057 320/107 |
| 2014/0365790 A1 | 12/2014 | Chen et al. |
| 2015/0291044 A1* | 10/2015 | Adachi ................ H01M 10/48 320/134 |
| 2016/0276843 A1 | 9/2016 | Chang et al. |
| 2016/0322676 A1 | 11/2016 | Jun et al. |
| 2016/0359344 A1 | 12/2016 | Chin et al. |

* cited by examiner

*Primary Examiner* — Robert Grant
(74) *Attorney, Agent, or Firm* — NovoTechIP International PLLC (57) ABSTRACT

Systems and methods for limiting battery discharge based on battery temperature are disclosed. In an example, a controller sets a current limit, using battery temperature, and provides corresponding current limits to a power management device and a system-on-chip (SOC). Upon battery discharge current exceeding the discharge current limit, the controller increases the discharge current limit, and provides updated current limits to the PM device and the SOC. Upon the battery temperature exceeding a battery pack maximum temperature, the controller issues a shutdown command to the PM device and the SOC.

17 Claims, 4 Drawing Sheets

DEVICES, SYSTEMS, AND METHODS FOR TEMPERATURE BASED LIMITING OF BATTERY PACK DISCHARGE

BACKGROUND

In mobile devices, battery pack temperatures can reach levels that can be undesirable and even unacceptable for a range of applications. There are known techniques that can monitor battery pack temperature and, when a threshold is reached, terminate the discharge. However, such action can render the mobile device non-operational.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure Devices and apparatuses are disclosed, and these include an apparatus for temperature based controlling battery pack discharge current, including a sensor interface for receiving a temperature measurement indicative of a temperature at a battery pack, and a control logic, coupled to the sensor interface, and configured to set a discharge current limit, based at least in part on the temperature measurement, and to provide, based at least in part on the discharge current limit, a current limit command to a system-on-chip (SOC) device coupled to a power rail. The control logic can, in addition, be configured to monitor a battery pack discharge current and, upon instances of the battery pack discharge current exceeding the discharge current limit, to increase the discharge current limit by an amount, and correspondingly update the current limit command to the SOC device, and to receive updates of the temperature measurement, upon the updated temperature measurement exceeding a battery package target temperature, to transmit a shutdown command to the SOC device.

Systems are disclosed, and these include a system for temperature-based controlling battery pack discharge current, that in turn can include a system-on-chip (SOC) device configured to receive an input power supply current, and a current limit command, and that can include a SOC current consumption control logic that can be configured to adjust a SOC current consumption parameter, in accordance with the current limit. The system can include a controller, configured to receive a temperature measurement indicative of a temperature at a battery pack, set a discharge current limit, based at least in part on the temperature measurement, generate, based at least in part on the set discharge current limit, the current limit command to the SOC device, monitor a battery pack discharge current and, upon each instance of the battery pack discharge current exceeding the discharge current limit, to increase the discharge current limit by an amount, and correspondingly update the current limit to the SOC device, and receive updates of the temperature measurement and, upon the updated temperature measurement exceeding a battery package target temperature, to transmit a shutdown command to the SOC device.

Methods are disclosed, and these include a method for temperature-based controlling battery pack discharge current, that can include receiving a temperature measurement indicative of a temperature at a battery pack; setting a discharge current limit, based at least in part on the temperature measurement; generating, based at least in part on the discharge current limit, a first current limit for a power management (PM) device coupled to the battery pack, and a second current limit for a system-on-chip (SOC) device coupled to a power rail of the PM device; monitoring a battery pack discharge current. In one example disclosed method, upon instances of the battery pack discharge current exceeding the discharge current limit, operations can be applied that can include increasing the discharge current limit by an amount, and correspondingly updating the first current limit to the PM device and the second current limit to the SOC device; as can include receiving updates of the temperature measurement and, upon the updated temperature measurement exceeding a battery package target temperature, transmitting a shutdown command to the PM device and the SOC device.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the disclosed subject matter. It will be apparent to persons of ordinary skill, upon reading this description, that various aspects can be practiced without such details.

In overview, systems and methods are disclosed that can provide temperature based setting of a maximum battery pack discharge current, and based on the maximum battery pack discharge current, can provide corresponding current limit commands to circuit devices and power management devices that can draw discharge current from the battery pack. Disclosed systems and methods can provide, in addition, a monitoring of the battery pack discharge current and of the battery pack temperature, enabling a controlled increase in battery discharge current, as an adaptation to circuit devices and power management devices exceeding the battery discharge limit, with a detection and safety shutdown of the battery discharge upon detecting a battery overheat. Disclosed systems and methods can additionally provide a soft limiting of battery discharge current, and soft reduction in device performance or capability, while better maintaining battery health, reducing overheating on device surfaces, and reducing instances of total interruption of device function.

Figure 1:
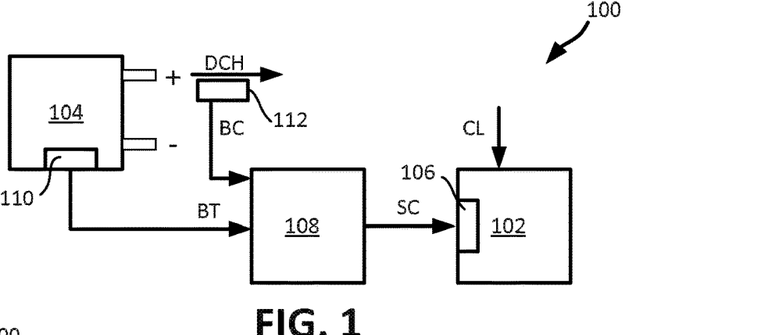
FIG. 1 illustrates a functional block diagram of one example system for temperature based limiting of battery discharge.

FIG. 1 illustrates a functional block diagram of one example system 100 for temperature based limiting of a battery discharge. Referring to FIG. 1, the system 100 can include a circuit device 102 configured to receive one or more device supply currents, represented collectively in FIG. 1 by a graphical line labeled "CL." The device supply currents CL can be delivered by a power management resource (not explicitly visible in FIG. 1), based on a discharge current DCH from a battery pack 104, that the resource can regulate to one or more CL voltages. Particular CL voltage(s) and techniques for regulating the CL voltage(s) are not necessarily specific to system 100 features of temperature based limiting of battery discharge. Further detailed description of such voltages and associated regulation of same is therefore omitted.

In an aspect, the circuit device 102 can be configured to include a device current consumption logic 106, configured to control, or to statistically affect, or both, the amount or average amount (e.g., in terms of milliamps) of the device 102's CL current consumption. The device current consumption logic 106 can include, for example, any one of, or any combination of two or more from among: gating logic to selectively disable various clock signals; clock frequency logic to selectively increase and decrease clock rates; and circuitry for voltage scaling. Upon reading the present disclosure, one or more of these techniques may be readily selected and adapted for these capabilities and functionalities of the device current consumption logic 106. The particular technique(s) selected and adapted are not necessarily specific to system 100 temperature based limiting of battery discharge and, accordingly, further detailed description of such omitted.

Referring again to FIG. 1, the system 100 can include a controller logic 108 configured to receive, from a temperature sensor 110, a temperature measurement, labeled "BT," indicative of a temperature at the battery pack 104, and to receive from a battery pack current sensor 112 a battery discharge current measurement, labeled "BC."

The controller logic 108 can be configured to set a battery discharge current maximum (not separately visible in FIG. 1), based at least in part on the temperature measurement BT, and can be further configured to generate and provide, based at least in part on the discharge current maximum, a current limit command SC to the circuit device 102. The circuit device 102 current consumption logic 108 can be configured to utilize the current limit command SC in configuring an operational state (e.g., a particular disabling of certain clocks, a particular clock frequency, or a particular combination of internal rail voltages, or any combination or sub-combination thereof). However, the current limit command SC is not necessarily a hard limit, as the controller logic 108 can be configured to increase the discharge current maximum upon the present maximum being exceeded. In a more specific example, the controller logic 108 can be configured to respond to instances of the battery pack discharge current exceeding the discharge current maximum by increasing that maximum by an amount, and correspondingly updating the current limit command SC. In an aspect, to prevent such increases from over-heating the battery pack 104, the controller logic 108 can be configured to monitor the battery pack temperature, for example, as a background loop, and to respond to detection of overheating by sending a shutdown instruction, at least to the circuit device 102. In a specific example of such a configuration, the controller logic 108 can compare the updated temperature measurements BT to a threshold.

Figure 2:
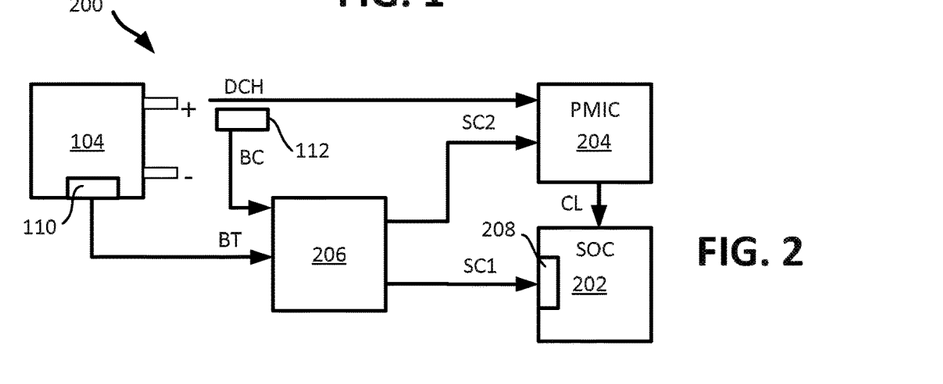
FIG. 2 illustrates a functional block diagram of one example system for temperature based limiting of battery discharge, including combination limiting of both a system-on-chip (SOC) device and power management (PM) device.

FIG. 2 illustrates a functional block diagram of one example system 200 for temperature based limiting of battery discharge, implementing the circuit device 102 as a SOC device 202, and including a power management (PM) device 204. The system 200 also implements the controller logic 108 as a controller logic 206 that includes logic to generate a second current limiting command, SC2, for the PM device 204. The PM device 204 can be, but is not necessarily, implemented as a power management integrated circuit (PMIC). To avoid description of details not necessarily related to concepts, an example system 200 can be assumed otherwise identical to the above-described system 100. For consistency with the context of FIG. 2, the current limiting command SC for the SOC device 202 will be referred to as "first current limiting command SC1." The SOC device 202 can include a device current consumption logic 208 that can be configured, for example, as described for the FIG. 1 device current consumption logic 106.

Referring again to FIG. 2, the PM device 204 can be configured to receive the discharge current DCH from the battery pack 104, and deliver the above-described device supply currents CL, at regulated voltage levels.

Figure 3:
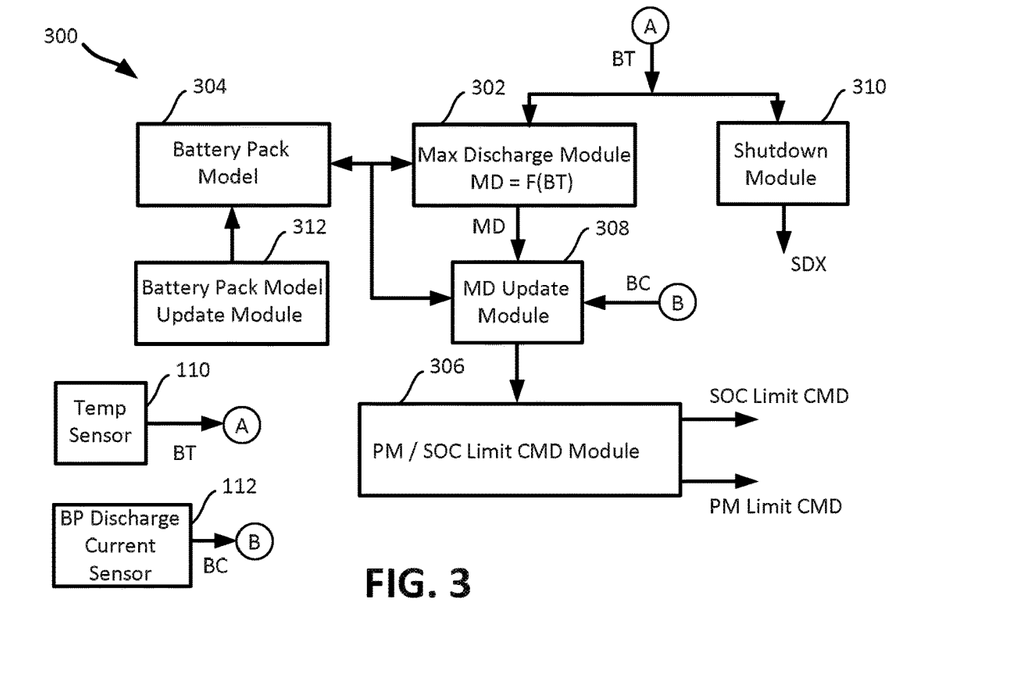
FIG. 3 illustrates a function block diagram of one example controller system for temperature based limiting of battery discharge current, including an exemplary control based, at least in part, on a battery pack model.

FIG. 3 illustrates a logic block diagram of one controller system 300, including a battery pack model based control, which can be one example implementation of the FIG. 2 controller logic 206, for temperature based limiting of battery pack discharge current. The illustrated controller system 300 can include a maximum discharge (MD) current setting module 302 configured to receive a battery pack temperature measurement, for example, BT from the temperature sensor 110 (also illustrated in FIG. 3) and, in response, to access a battery pack model 304 that can include an analytical model of the battery pack, for example, the battery pack 104, and generate a MD current value. The battery pack model 304 can be implemented, for example, to operate as a continuous function of at least BT, of a general form such as illustrated by Equation (1) below, or a discrete form approximation thereof.

$$MD = F(BT) \qquad \text{Equation (1)}$$

The formula, F, can be constructed using, for example, system thermal models, or through testing during the design process, or both.

Guidelines for configuring the battery pack model 304 can include:
  i) providing acceptable level of complexity of computations to obtain MD;
  ii) generating a temperature-based MD that,
    a) assuming the battery pack discharge current does not exceed MD, will provide an acceptably low probability of battery overheating; and b) does not unacceptably reduce the capability of the SOC device 202, for example, due to current reduction operations and modes applied by the SOC device 202 logic to avoid exceeding MD.

Regarding implementation of the battery pack model 304, one example can implement the model, at least in part, using functionality of the PM device 204. For example, one or more implementation of the PM device 204 can include capability to store values of an internal resistance of the battery pack, for example, as data pairs that can include a value of the internal resistance and corresponding state-of-charge (SCH) value. In addition, the PM device 204 can include a coulomb counter (not visible in FIG. 2) that can implement, at least in part, a battery pack current sensor, such as the battery pack current sensor 112.

Referring again to FIG. 3, the illustrated controller system 300 can include a PM/SOC Limit Command module 306, configured to generate a PM device current limit command, PM Limit CMD, and an SOC device current limit command, SOC Limit CMD, based at least in part on the MD value set by the MD current setting module 302. The PM/SOC Limit Command module 306 can be configured to generate PM Limit CMD and SOC Limit CMD based, for example, on a stored mapping (not separately visible in FIG. 3) of operational modes of the PM device 204 and the SOC device 202, and of device current requirements in each of the operational modes. As one illustration of such an implementation, a hypothetical SOC device 202 will be assumed as having four operational modes, each requiring a different current level. An example mapping could store this information in a manner enabling the PM/SOC Limit Command module 306 to determine the maximum operational mode of the SOC device 202 having a device current requirement within the given MD level. The example can also store a coding for the PM Limit CMD and SOC Limit CMD readable by the PM device 204 and the SOC device 202, respectively. In addition, to provide for current requirements of the PM device 204 and the SOC device 202 that may be temperature dependent, the PM/SOC Limit Command module 306 can be configured to store temperature coefficients.

Referring again to FIG. 3, the illustrated controller system 300 can include an MD update module 308, configured to monitor the battery pack discharge current, e.g., from the battery pack discharge current sensor 112 and, in response to that discharge current exceeding MD, to increase MD, and to cause the PM/SOC Limit Command module 306 to generate a corresponding updated PM Limit CMD and SOC Limit CMD.

The illustrated controller system 300 can also include a shutdown module 310, configured to monitor the battery pack temperature, e.g., from the battery temperature sensor 110 and, in response to detecting the temperature as exceeding a given maximum, e.g., a "do not exceed temperature," or equivalent, to issue a shutdown command, SDX, to the PM device 204, or to the SOC device 202, or both.

The shutdown triggering described above for the shutdown module 310 is a simple threshold level trigger. In one example alternative implementation, the shutdown module 310 can be configured to issue the shutdown command SDX upon BT exceeding a temperature threshold for longer than a given duration, instead of triggering based solely on exceeding the threshold. Such a feature may, for example, enable a mobile device to perform short duration, high load operations without shutdown. Example implementations can include, but are not limited to, averaging of the BT signal, e.g., a resistor-capacitor averaging circuit driven by an analog BT. The controller system 300 can also include logic to override the shutdown module 310, for example, for testing purposes.

The controller system 300 can also be configured with a battery pack model update module 312 for updating the battery pack model 304 in response to one or more updating conditions. Updating conditions can include, but are not limited to, the battery pack maximum temperature being exceeded even though the battery pack discharge current DCH is less than the MD value generated using an existing configuration of the battery pack mode 304. Another example updating condition can be to update the battery pack model 304 every discharge cycle. Another example updating condition can be to update the battery pack model 304 based on a time or calendar schedule.

Figure 4:
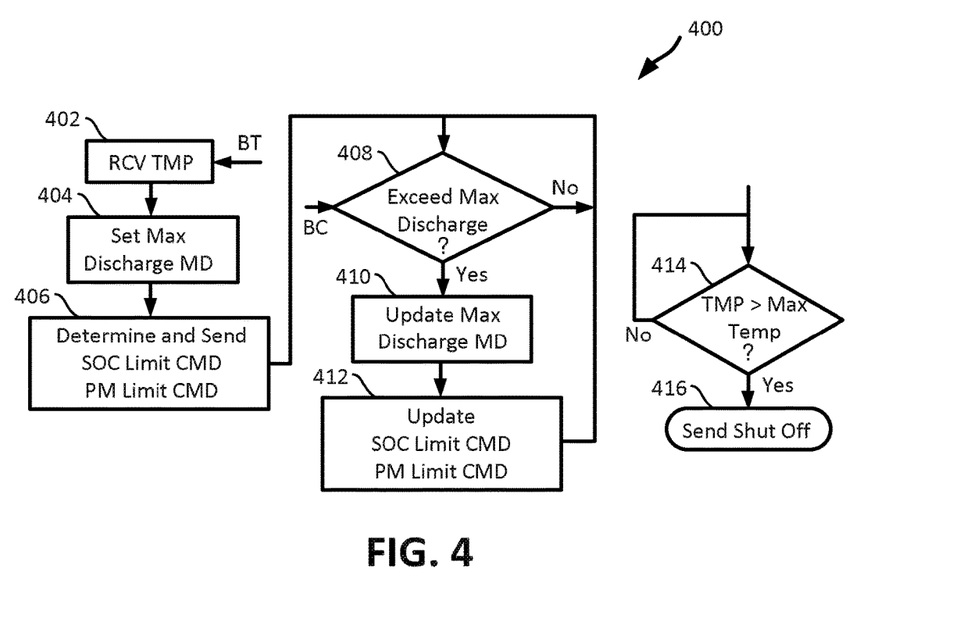
FIG. 4 illustrates a logic flow diagram of example operations in one process for temperature based limiting of battery discharge current including a process of combination limiting commands for SOC device and for PM device.

FIG. 4 illustrates a logic flow diagram of example operations in one flow 400 within a process for temperature based limiting of battery discharge. Example operations in the flow 400 will be described with reference to the FIG. 3 system 300. This is not intended as a limitation on the scope of system implementations on which the process 400 can be practiced. Operations in the flow 400 are described in sequential order. This is not intended as a limitation on the temporal relation of operations. On the contrary, various operations described in reference to different FIG. 4 blocks can be performed concurrent with one another, or fully or partially overlapping in time with one another. It will also be understood that the order of operations in the flow 400 can be re-arranged from the graphical arrangement in which they appear on FIG. 4, and from the order in which they are referenced in the description.

Referring to FIG. 4, in an example instance, operations in the flow 400 can start at 402, for example, in response to a power-up of a device (not explicitly visible in FIG. 3 or 4) that includes a system for temperature based limiting of battery discharge, for example, the FIG. 3 system 300. Operations at 402 can include receiving a temperature measurement of a battery pack, for example, receiving the temperature sensor 110 output BT at the FIG. 2 controller logic 206, or at the FIG. 3 MD current setting module 302. The flow 400 can then proceed to 404 and apply operations of setting a MD current value, MD. One example of operations at 404 can include the FIG. 3 MD current setting module 302 accessing the battery pack model 306 and retrieving battery model parameters sufficient to define MD as a function of BT. It will be understood that "accessing," in this context, can include the battery pack model 306 being integral with the MD current setting module 302.

Referring again to FIG. 4, after operations at 404 of setting MD, the flow 400 can proceed to 406 and apply operations of determining, based at least in part on MD, a value for the SOC current limit command, labeled "SOC Limit CMD," and a value for the PM device current limit CMD, labeled "PM Limit CMD," and then send SOC Limit CMD and PM Limit CMD to an SOC device and PM device, respectively. One example of operations at 406 can include the FIG. 3 PM/SOC Limit CMD module 306 generating SOC Limit CMD and PM Limit CMD, based on MD received from the FIG. 3 MD current setting module 302, and sending these values to the FIG. 2 SOC device 202 and PM device 204, respectively. It will be understood that "send," in this context, can include the FIG. 2 controller logic 206 being integral to the FIG. 2 SOC device 202, or the FIG. 2 controller logic 206 being integral to the FIG. 2 PM device 204, or a combination of both.

The flow 400 can then proceed to 408 and apply operations of receiving the battery pack discharge current measurement BC and determining whether BC exceeds the MD current value that was set at 404. Upon a negative result at 408, meaning the battery pack discharge current does not exceed MD set at 404, the flow 400 can remain at 408 and repeat, for example, periodically, the above-described operation of testing the battery pack discharge current. Upon a positive result at 408, meaning the discharge current exceeds MD set at 404, the flow 400 can proceed to 410, update the MD value, then to 412, update SOC Limit CMD and PM Limit CMD based on the updated MD, and send the updated SOC Limit CMD and PM Limit CMD to the SOC device 202 and PM device 204, respectively. After operations at 410, the flow 400 can return to 408 and repeat the above-described loop of conditionally updating, e.g., increasing, the MD current value.

One example of operations at 408, 410, and 412 can include the FIG. 3 MD update module 308 receiving BC from the FIG. 2 battery discharge current sensor 114, and increasing MD upon determining the discharge current exceeds the MD value set at 404, then sending the increased MD to the PM/SOC Limit CMD module 306. The PM/SOC Limit CMD module 306, in turn, can update the SOC Limit CMD and PM Limit CMD, and send the updated values to the FIG. 2 SOC device 202 and PM device 204 respectively.

Referring to FIG. 4, either independent from or triggered by the above-described instances of updating MD and corresponding updating of SOC Limit CMD and PM Limit CMD, the flow 400 can apply, for example, as a background operation, a periodic testing at 412 of the battery pack temperature. Upon the loop detecting the maximum is exceeded, the flow 400 can proceed to 414 and issue a shutdown command.

Referring again to FIGS. 2 and 3, one example of operations at 414 and 416 can include the FIG. 3 shutdown module 310 receiving, e.g., periodically, the battery pack temperature measurement BT from the battery pack temperature sensor 110, and issuing a shutdown command in response to detecting an overheat state, as described above.

In one alternative implementation, the battery pack temperature sensor 110 can be configured to detect the battery pack temperature exceeding the maximum and, in response, send an alarm-type signal to the FIG. 3 shutdown module 310.

Figure 5:
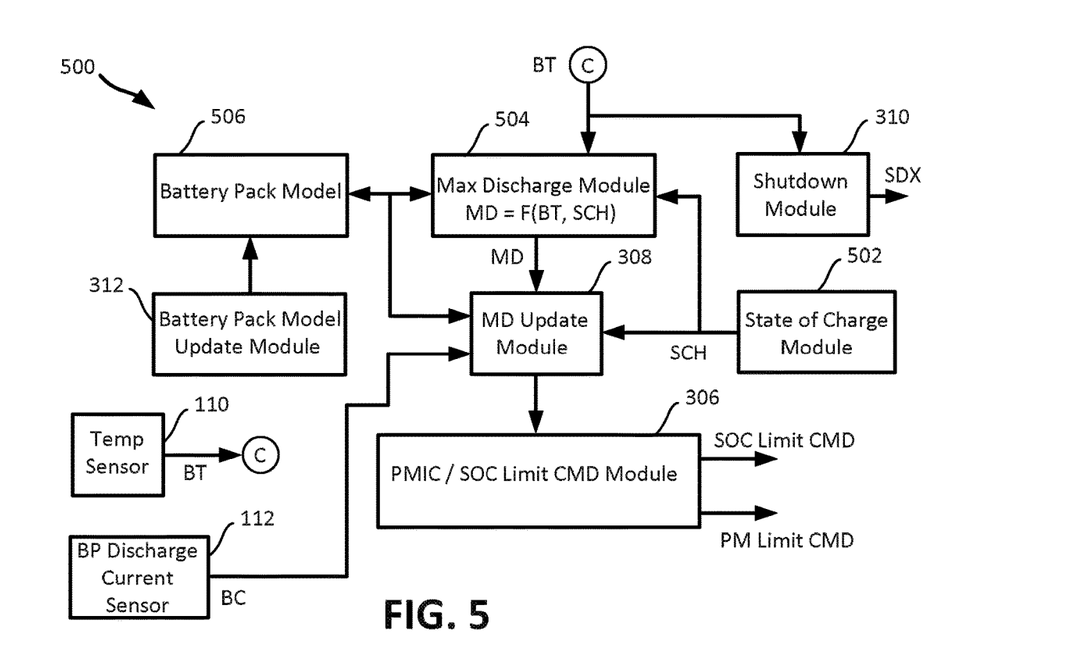
FIG. 5 illustrates a logic block diagram of one example controller system for temperature based limiting of battery pack discharge current including features of the FIG. 3 example system and further including state-of-charge based monitoring and discharge limiting.

FIG. 5 illustrates a function block diagram of one example controller system 500 for temperature based limiting of battery discharge, including features of the FIG. 3 example system 300 and further including a combination temperature-based and state-of-charge based discharge limiting. Referring to FIG. 5, the illustrated controller system 500 can include a state-of-charge monitor module 502, configured to monitor or periodically calculate a state-of-charge of the battery pack 104 and generate a corresponding state-of-charge data "SCH." One example implementation of the state-of-charge monitor module 502 can include a coulomb counter (not visible in the figures) in the PM device 204.

The controller system 500 can include a temperature and state of charge based MD current setting module 504, which can be a modification of the FIG. 3 MD current setting module 302, further configured to determine MD based on, e.g., as a function of, SCH in combination with the battery pack temperature BT, using a BT-SCH based battery pack model 506, which can be a modification of the FIG. 3 battery pack model 306. The MD current setting module 504 can be configured to generate MD as a function of BT and SCH, of a form such as illustrated by Equation (2):

$$MD = F(BT, SCH) \quad \text{Equation (2)}$$

The controller system 500 can be assumed otherwise identical to the controller system 300.

Figure 6:
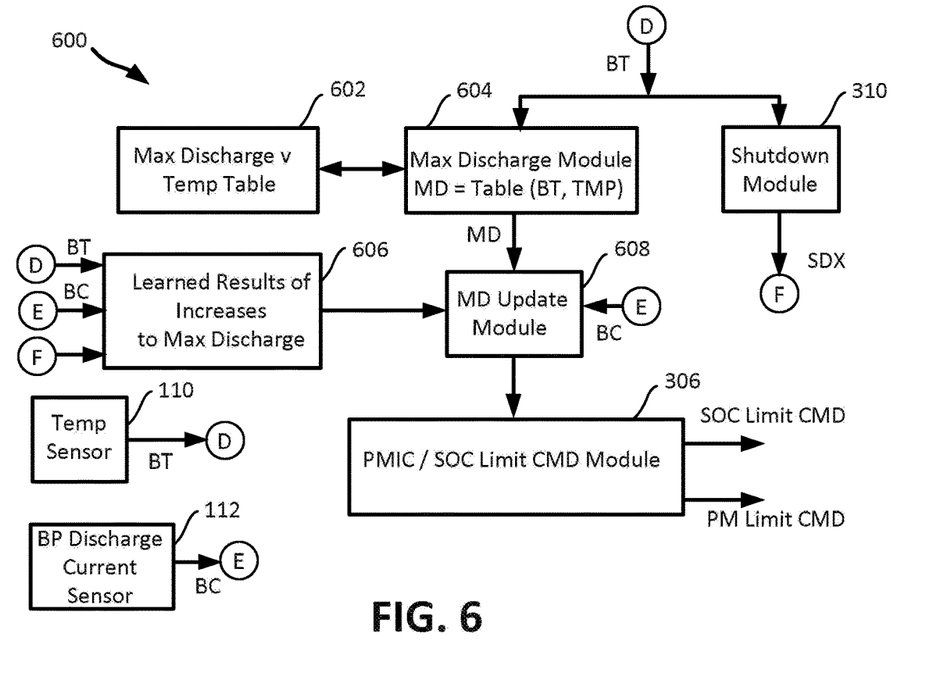
FIG. 6 illustrates a logic block diagram of one example controller system for temperature based limiting of battery pack discharge current, including an exemplary discharge temperature table-based, and learned results table-based, discharge limiting.

FIG. 6 illustrates a function block diagram of one example controller system 600 (hereinafter "controller system 600") for temperature based limiting of battery discharge, including an exemplary table-based MD setting and learned results table-based MD updating discharge limiting feature. The illustrated example of the controller system 600 can include a MD v BT table 602 configured to store, for example, a plurality of different values of BT and, for each of the values, a corresponding MD value. The MD v BT table 602 can be configured with this information, for example, at time of manufacture. Optionally, the controller system 600 can be arranged to enable post-manufacture installation of new table content for the MD v BT table 602. The controller system 600 can further include MD generation module 604, configured to receive BT and, in response, access the MD v BT table 602 and generate a corresponding MD.

In an aspect, the controller system 600 can include a learned results module 606, configured to store instances of incrementing MD in response to DCH exceeding a present MD and, with each instance, store present state information, e.g., present BT, and the amount of the increment of MD. In an aspect, the learned results module 606 can be further configured to monitor and store information characterizing a result of the incrementing, e.g., BT exhibited at the next MD value, time duration that the next MD value is sufficient before DCH exceeds MD again. The learned results module 606 can be further configured to remove or pare particular updating of MD that produced undesired results. Regarding information stored with each updating instance, the learned results module 606 can be further configured to store trigger information, e.g., duration of high current (e.g., DCH) pulse.

Referring again to FIG. 6, the controller system 600 can also include an MD update module 608, configured to respond to DCH exceeding a current MD by accessing the learned results module 606 and selecting a previously executed updating, e.g., increasing of MD, from the current value of MD that produced acceptable results.

Referring to FIGS. 3 and 6, systems can implement generation and updating of MD and updating of MD using a combination of an analytical model of the battery pack, such as the battery pack model 304, and a table-based and learned results table-based MD updating, such as provided by the learned results module 606.

Figure 7:
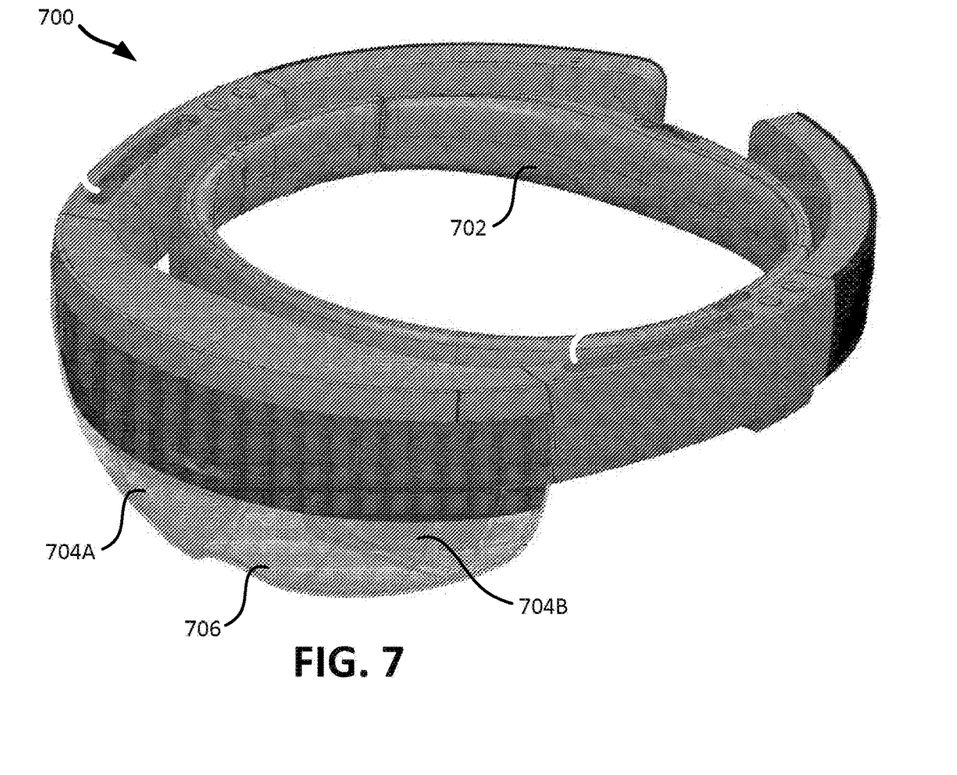
FIG. 7 illustrates an example of a portable electronic device incorporating an example system for temperature based limiting of battery discharge current.

FIG. 7 illustrates an example of a portable electronic device 700 incorporating an example temperature-based battery discharge limiting system such as disclosed by one or more examples set forth hereinabove and in the figures that form part of this disclosure. The portable electronic device 700 can include a battery pack (not visible in FIG. 7) in an arrangement of a temperature-based discharge current limiting system that may include the various features, properties, characteristics, materials, and/or arrangements as described above with reference to FIGS. 1-6. In the example illustrated in FIG. 7, the portable electronic device 700 includes a head mounted display (HMD) and associated electronic components. Such HMDs may be used for virtual reality (VR), augmented reality (AR), and mixed reality (MR) applications. The particular example illustrated in FIG. 7 is a self-contained AR device including electronic components configured for, and capable of functions including sensing, computing, signal processing, graphics processing, and display functions. The illustrated portable electronic device 700 is similar in many respects to the HoloLens by Microsoft of Redmond, Wash., US. Examples of similar devices are described in U.S. Patent Application Publication Nos. 2016/0212888 (published on Jul. 21, 2016) and 2017/0099749 (published on Apr. 6, 2017), which are each incorporated herein by reference in their entireties.

Portable electronic device 700 includes a headband 702 for placing the portable electronic device 700 on a user's head. Portable electronic device 700 includes an electronic processing section (not explicitly visible in FIG. 7) that can be powered by a battery pack, such as the battery pack 104, arranged in a temperature-based discharge current limiting system, such as any of the systems described in reference to FIGS. 1-6. Portable electronic device 700 includes a left see-through display device 704A for a user's left eye and a right see-through display device 704B for a user's right eye, for which a protective shield 706 is provided.

Figure 8:
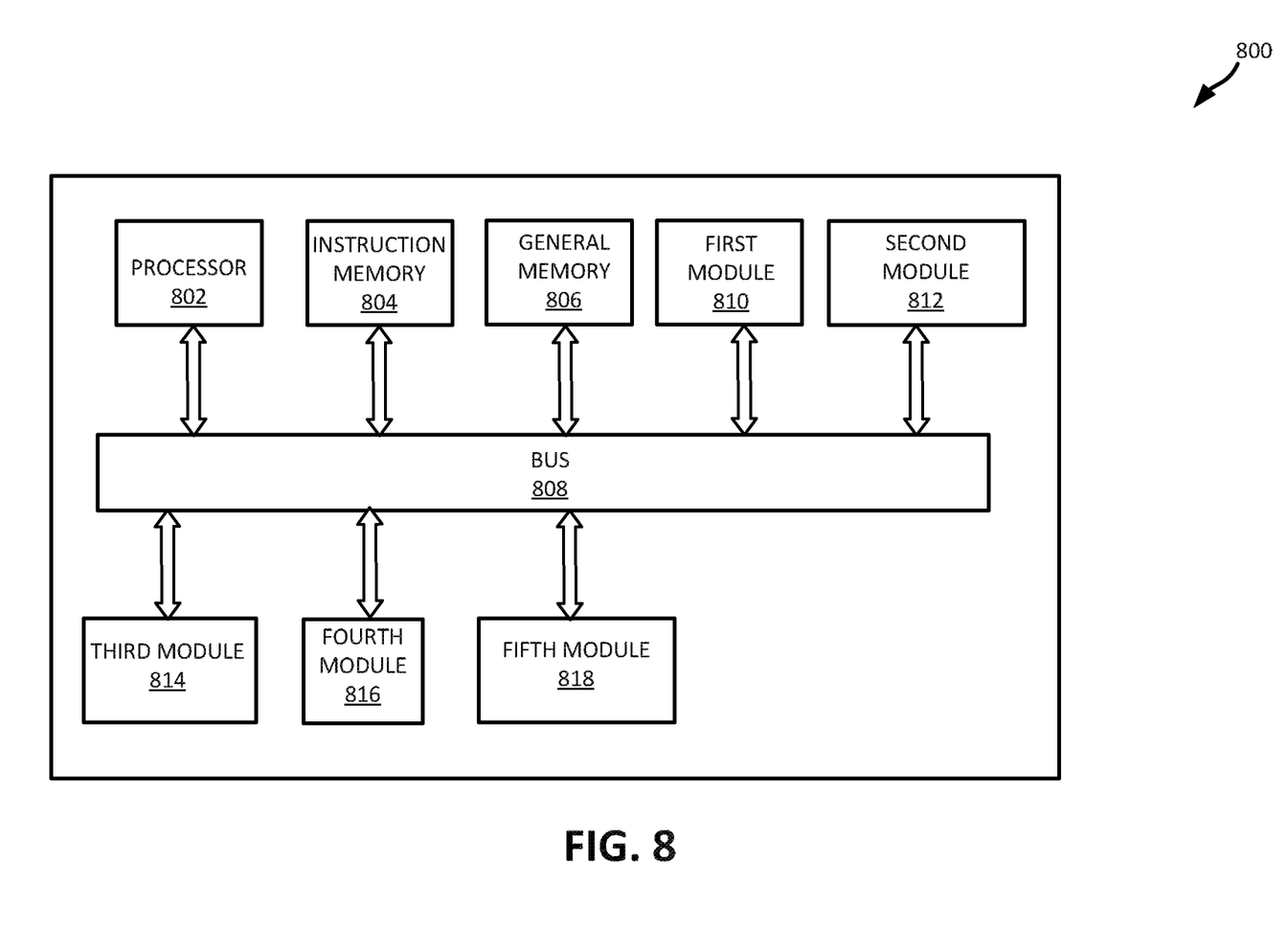
FIG. 8 illustrates a logic block diagram of one programmable processor configured to perform processes of one or more disclosed systems and methods for temperature based limiting of battery discharge current.

FIG. 8 illustrates a functional block diagram 800 of one example implementation of the controller logic 206, configured to perform various processes and operations defined according to disclosed systems and methods. The functional block diagram 800 will be referred to as the "processor 800." It will be understood that functional blocks illustrated in FIG. 8 are logical blocks, and do not necessarily correspond to particular hardware. For example, the processor 800 can be provided by processing and storage resources of a portable electronic device, such as the HMD and associated electronic components of the FIG. 7 portable electronic device 700.

Referring again to FIG. 8, the image processor 800 can include a data processor 802, instruction memory 804, and a general purpose memory 806, coupled by a bus 808. The instruction memory 806 can include a tangible medium retrievably storing computer-readable instructions, labeled as "first module" 810, that when executed by the data processor 802 cause the processor to perform operations, such as described for the MD current setting module 302, and storing computer-readable instructions, labeled as "second module" 812, that when executed by the data processor 802 cause the processor to perform operations, such as described for the PM/SOC Limit Command module 306. The instruction memory 806 can store, on the tangible medium, computer-readable instructions, labeled as "third module" 814, that when executed by the data processor 802 cause the processor to perform operations such as described for the MD update module 308; and can store computer-readable instructions, labeled as "fourth module" 816 and "fifth module" 818, respectively, that when executed by the data processor 802 cause the processor to perform operations, such as described for the shutdown module 310 and the battery pack model update module 312.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended to be as broad as is consistent with the ordinary meaning of the language that is used in the claims when interpreted in light of this specification and the prosecution history that follows, and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as "first" and "second" and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that includes the element.

The Abstract of the Disclosure is provided to allow the reader to quickly identify the nature of the technical disclosure, and is not intended to be used to interpret or limit the scope or meaning of the claims. In addition, in the foregoing Detailed Description, it can be seen that various features are grouped together in various examples. This is for the purpose of streamlining the disclosure, and is not to be interpreted as reflecting an intention that any claim requires more features than the claim expressly recites. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. An apparatus for temperature based controlling battery pack discharge current, the apparatus comprising:
   a sensor interface configured to receive a temperature measurement indicative of a temperature at a battery pack; and
   a control logic, coupled to the sensor interface, and configured to:
   set a discharge current limit, based at least in part on the temperature measurement,
   provide, based at least in part on the discharge current limit, a current limit command to a system-on-chip (SOC) device coupled to a power rail,
   monitor a battery pack discharge current and, upon instances of the battery pack discharge current exceeding the discharge current limit, to:
   increase the discharge current limit by an amount, and
   correspondingly update the current limit command to the SOC device; and receive updates of the temperature measurement, upon the updated temperature measurement exceeding a battery package target temperature, to transmit a shutdown command to the SOC device.

2. The apparatus of claim 1 for controlling battery pack discharge current, wherein:
the current limit command is a first current limit command,
the control logic is further configured to:
provide, in association with the first current limit command and based at least in part on the discharge current limit, a second current limit command to a power management (PM) device coupled to the power rail,
update the second current limit command to the PM device in association with updating the first current limit command to the SOC device, and
transmit the shutdown command to the PM device in association with transmitting the shutdown command to the SOC device.

3. The apparatus of claim 2 for controlling battery discharge current, wherein the control logic is further configured to:
store an analytical model of the battery pack, and
set the discharge current limit further based at least in part on the analytical model of the battery pack.

4. The apparatus of claim 3 for controlling battery discharge current, wherein the amount is based at least in part on a combination of the analytical model of the battery pack and a recently received update of the temperature measurement of the battery pack.

5. The apparatus of claim 3 for controlling battery discharge current, wherein the control logic is further configured to update the stored analytical model of the battery pack in association with at least one update of the temperature measurement of the battery pack.

6. The apparatus of claim 3 for controlling battery discharge current, wherein the control logic is further configured to:
monitor a state of charge (SCH) of the battery pack; and
set the discharge current limit further based at least in part on the SCH.

7. The apparatus of claim 2 for controlling battery discharge current, wherein the control logic is further configured to:
set the discharge current limit further based at least in part on a content of a table of a past history of setting the discharge current limit, and
update the table, based at least in part on a result of monitoring the temperature measurement.

8. The apparatus of claim 2 for controlling battery discharge current, wherein the control logic is further configured to:
set the amount of the increase of the discharge current limit further based at least in part on a content of a table of a past history of increasing the discharge current limit, and
update the table, based at least in part on a result of monitoring the temperature measurement.

9. The apparatus of claim 2 for controlling battery discharge current, wherein at least a portion of the control logic is embedded in the SOC, or at least a portion of the control logic is embedded in the PM device, or both.

10. A system for controlling battery pack discharge current, the system comprising:
a system-on-chip (SOC) device configured to receive an input power supply current, and a current limit command, and that includes a SOC power control logic that is configured to adjust a SOC power consumption parameter, in accordance with the current limit;
a controller configured to:
receive a temperature measurement indicative of a temperature at a battery pack,
set a discharge current limit, based at least in part on the temperature measurement,
generate, based at least in part on the set discharge current limit, the current limit command to the SOC device,
monitor a battery pack discharge current and, upon each instance of the battery pack discharge current exceeding the discharge current limit, to
increase the discharge current limit by an amount, and
correspondingly update the current limit to the SOC device, and
receive updates of the temperature measurement and, upon the updated temperature measurement exceeding a battery package target temperature, to transmit a shutdown command to the SOC device.

11. The system of claim 10 for controlling battery pack discharge current, wherein:
the current limit command is a first current limit command,
the controller is further configured to generate, based at least in part on the set discharge current limit, a second current limit command for the PM device, and
wherein the system further includes:
a power management (PM) device configured to couple to the battery pack and to provide the input power supply current to the SOC device, and that includes a PM device control logic configured to adjust a power management parameter, and
wherein the controller is further configured to transmit the shutdown command to the SOC device and the PM device.

12. A method for controlling battery pack discharge current, the method comprising:
receiving a temperature measurement indicative of a temperature at a battery pack;
setting a discharge current limit, based at least in part on the temperature measurement;
generating, based at least in part on the discharge current limit, a first current limit for a power management (PM) device coupled to the battery pack, and a second current limit for a system-on-chip (SOC) device coupled to a power rail of the PM device;
monitoring a battery pack discharge current and, upon instances of the battery pack discharge current exceeding the discharge current limit,
increasing the discharge current limit by an amount, and
correspondingly updating the first current limit to the PM device and the second current limit to the SOC device;
receiving updates of the temperature measurement and, upon the updated temperature measurement exceeding a battery package target temperature, transmitting a shutdown command to the PM device and the SOC device.

13. The method of claim 12 for controlling battery discharge current, further including:

storing an analytical model of the battery pack, and wherein setting the discharge current limit is further based at least in part on the analytical model of the battery pack.

14. The method of claim 13 for controlling battery discharge current, wherein the amount is based at least in part on a combination of the analytical model of the battery pack and a recently received update of the temperature measurement of the battery pack.

15. The method of claim 13 for controlling battery discharge current, further including:

updating the stored analytical model of the battery pack in association with at least one updating of the temperature measurement of the battery pack.

16. The method of claim 13 for controlling battery discharge current, further including:

monitoring a state of charge (SCH) of the battery pack; and setting the discharge current limit further based at least in part on the SCH.

17. The method of claim 12 for controlling battery discharge current, wherein:

setting the discharge current limit is further based at least in part on a content of a table of a past history of setting the discharge current limit based, at least in part, on the temperature measurement, and wherein the method further includes updating the table, based at least in part on a result of monitoring the temperature measurement.

* * * * *